(12) United States Patent
Hu

(10) Patent No.: US 11,004,980 B2
(45) Date of Patent: May 11, 2021

(54) THIN FILM TRANSISTOR HAVING VERTICAL CHANNEL AND MANUFACTURING METHOD THEREFOR, ARRAY SUBSTRATE, DISPLAY PANEL AND DISPLAY DEVICE

(71) Applicant: BOE TECHNOLOGY GROUP CO., LTD., Beijing (CN)

(72) Inventor: Hehe Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/327,208

(22) PCT Filed: May 29, 2018

(86) PCT No.: PCT/CN2018/088844
§ 371 (c)(1),
(2) Date: Feb. 21, 2019

(87) PCT Pub. No.: WO2018/223871
PCT Pub. Date: Dec. 13, 2018

(65) Prior Publication Data
US 2019/0221673 A1    Jul. 18, 2019

(30) Foreign Application Priority Data

Jun. 7, 2017    (CN) .......................... 201710422080.3

(51) Int. Cl.
*H01L 29/786* (2006.01)
*H01L 29/417* (2006.01)
(Continued)

(52) U.S. Cl.
CPC .. *H01L 29/78642* (2013.01); *H01L 29/41733* (2013.01); *H01L 29/41741* (2013.01);
(Continued)

(58) Field of Classification Search
CPC ......... H01L 29/78642; H01L 29/78603; H01L 29/41741; H01L 29/41733;
(Continued)

(56) References Cited

U.S. PATENT DOCUMENTS

| 6,642,575 B1 * | 11/2003 | Ono | ............... | H01L 21/823828 |
| | | | | 257/302 |
| 2006/0125025 A1 * | 6/2006 | Kawashima | ...... | H01L 29/42384 |
| | | | | 257/401 |

(Continued)

FOREIGN PATENT DOCUMENTS

| CN | 104022156 A | 9/2014 |
| CN | 105932066 A | 9/2016 |
| CN | 107195687 A | 9/2017 |

OTHER PUBLICATIONS

International Search Report and English Translation of Box V of the Written Opinion dated Aug. 30, 2018, received for corresponding Chinese Application No. PCT/CN2018/088844.

*Primary Examiner* — Mohammad M Hoque
(74) *Attorney, Agent, or Firm* — Kinney & Lange, P.A.

(57) ABSTRACT

Disclosed are a thin film transistor and a manufacturing method therefor, an array substrate, a display panel and a display device. The thin film transistor includes a base substrate; a first electrode on the base substrate; a second electrode on the first electrode; an active layer provided on the base substrate and connecting the first electrode with the second electrode; and a gate electrode on the base substrate. The base substrate includes an upper surface facing towards the first electrode, the active layer includes a first side surface extending in a direction intersecting the upper surface of the base substrate, the first side surface connects the first electrode with the second electrode, and the gate electrode surrounds the first side surface.

14 Claims, 13 Drawing Sheets

(51) Int. Cl.
*H01L 29/66* (2006.01)
*H01L 29/423* (2006.01)

(52) U.S. Cl.
CPC .. *H01L 29/42384* (2013.01); *H01L 29/66742* (2013.01); *H01L 29/78603* (2013.01); *H01L 29/78696* (2013.01)

(58) Field of Classification Search
CPC ......... H01L 29/78696; H01L 29/66742; H01L 29/42384
USPC .......................................................... 257/72
See application file for complete search history.

(56) References Cited

U.S. PATENT DOCUMENTS

| | | |
|---|---|---|
| 2013/0161732 A1 | 6/2013 | Hwang et al. |
| 2015/0340512 A1 | 11/2015 | Li et al. |
| 2016/0365370 A1* | 12/2016 | Ellinger ............ H01L 29/78642 |
| 2018/0102383 A1* | 4/2018 | Kim .................... H01L 27/3248 |
| 2018/0175205 A1 | 6/2018 | Liu |

* cited by examiner

THIN FILM TRANSISTOR HAVING VERTICAL CHANNEL AND MANUFACTURING METHOD THEREFOR, ARRAY SUBSTRATE, DISPLAY PANEL AND DISPLAY DEVICE

CROSS-REFERENCE TO RELATED APPLICATION

This application is a Section 371 National Stage Application of International Application No. PCT/CN2018/088844, filed on May 29, 2018, entitled "THIN FILM TRANSISTOR AND MANUFACTURING METHOD THEREFOR, ARRAY SUBSTRATE, DISPLAY PANEL AND DISPLAY DEVICE", which claims priority to Chinese Patent Application No. 201710422080.3 filed on Jun. 7, 2017 in the State Intellectual Property Office of China, the whole disclosure of which is incorporated herein by reference.

TECHNICAL FIELD

The present disclosure relates to the field of display technologies, and in particular, to a thin film transistor and a method for manufacturing the thin film transistor, an array substrate, a display panel, and a display device.

BACKGROUND

With the continuous development of display technologies, display panels are developing rapidly, and demands such as high-resolution and narrow frame for the display panels are also increasing. Thereby, thin film transistors (TFTs) need to be miniaturized while they need a higher charging efficiency. As a width of a channel of the thin film transistor is increased, a performance of a display device including the thin film transistor may be improved. However, the width of the channel of the thin film transistor is limited due to an aperture ratio of the display device, so that it is difficult to obtain a maximum improvement on the performance of the display device.

SUMMARY

In one aspect, it is provided a thin film transistor. The thin film transistor includes a base substrate; a first electrode on the base substrate; a second electrode on the first electrode; an active layer provided on the base substrate and connecting the first electrode with the second electrode; and a gate electrode on the base substrate. The base substrate includes an upper surface facing towards the first electrode, the active layer includes a first side surface extending in a direction intersecting the upper surface of the base substrate, the first side surface connects the first electrode with the second electrode, and the gate electrode surrounds the first side surface.

Optionally, the active layer further includes at least one side surface selected from a second side surface, a third side surface and a fourth side surface, each of the second side surface, the third side surface and the fourth side surface extending in a direction intersecting the upper surface of the base substrate, the at least one side surface selected from the second side surface, the third side surface and the fourth side surface connecting the first electrode with the second electrode, the gate electrode further surrounding the at least one side surface selected from the second side surface, the third side surface and the fourth side surface.

Optionally, the thin film transistor further includes a first insulating layer between the first electrode and the second electrode, the first insulating layer including at least one side surface, the at least one side surface of the first insulating layer being a surface of the first insulating layer which is not in contact with the first electrode or the second electrode, and the active layer surrounding the at least one side surface of the first insulating layer.

Optionally, the first insulating layer includes at least two side surfaces, the active layer surrounding the at least two side surfaces of the first insulating layer.

Optionally, the first insulating layer includes at least four side surfaces, the active layer surrounding the at least four side surfaces of the first insulating layer.

Optionally, the active layer is positioned between the first electrode and the second electrode.

Optionally, an orthographic projection of the active layer on the base substrate is within an orthographic projection of each of the first electrode and the second electrode on the base substrate.

Optionally, the thin film transistor further includes a second insulating layer between the active layer and the gate electrode.

Optionally, the active layer includes: a first contact face for contacting the first electrode; and a second contact face for contacting the second electrode, wherein an area of a cross section of at least one of the first contact face and the second contact face in a direction parallel to the base substrate is larger than an area of a cross section of the first side surface in the direction parallel to the base substrate.

Optionally, an orthographic projection of the active layer on the base substrate at least partially overlaps with an orthographic projection of the second electrode on the base substrate.

Optionally, an orthographic projection of the gate electrode on the base substrate covers an orthographic projection of the active layer on the base substrate.

Optionally, a material of at least one of the first insulating layer and the second insulating layer includes aluminum oxide.

Optionally, at least one of the first electrode and the second electrode includes a single-layer metal structure or a multilayer metal structure.

Optionally, a part of a cross section of each of the first insulating layer and the second electrode in a direction perpendicular to the base substrate has a positive trapezoidal shape.

In another aspect, it is provided an array substrate including the thin film transistor as stated above.

In a further aspect, it is provided a display panel including the array substrate as stated above.

In another further aspect, it is provided a display device including the display panel as stated above.

In still another further aspect, it is provided a method for manufacturing a thin film transistor, including: forming a first electrode on a base substrate, the first electrode being one of a source electrode and a drain electrode; forming a first insulating layer on the first electrode; forming a second electrode on the first insulating layer, the second electrode being the other one of the source electrode and the drain electrode; forming an active layer connecting the first electrode with the second electrode, the active layer surrounding at least a part of side surfaces of the first insulating layer; forming a second insulating layer covering the active layer; and forming a gate electrode surrounding at least a part of side surfaces of the active layer.

Optionally, at least one of the first insulating layer, the second insulating layer and the active layer is formed through an atomic layer deposition process.

In still another further aspect, it is provided a method for manufacturing a thin film transistor, including: forming a first electrode on a base substrate, the first electrode being one of a source electrode and a drain electrode; forming an active layer on the first electrode; forming a second electrode on the active layer, the second electrode being the other one of the source electrode and the drain electrode; forming an insulating layer covering the active layer; and forming a gate electrode surrounding at least a part of side surfaces of the active layer, wherein the at least a part of side surfaces of the active layer connects the first electrode with the second electrode.

DETAILED DESCRIPTION OF EMBODIMENTS

It should be noted that expressions such as "on", "located on", "formed on", "disposed on", "provided on" and the like herein may mean that one layer is located, formed, disposed or provided directly on another layer, and also mean that one layer is located, formed, disposed or provided indirectly on another layer, that is, there may be other layer(s) between the one layer and the another layer.

The shape and size of each of film layers in the accompanying drawings does not reflect a true shape and size of a thin film transistor, and they may be merely intended to explain the present disclosure.

Figure 1:
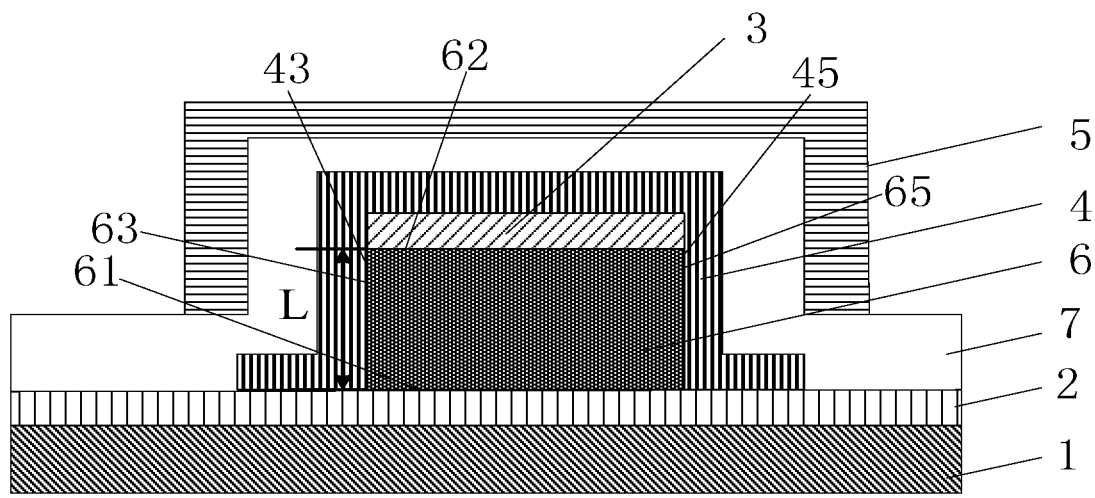
FIG. 1 is a schematic structural view of a thin film transistor according to an exemplary embodiment of the present disclosure.
Figure 2:
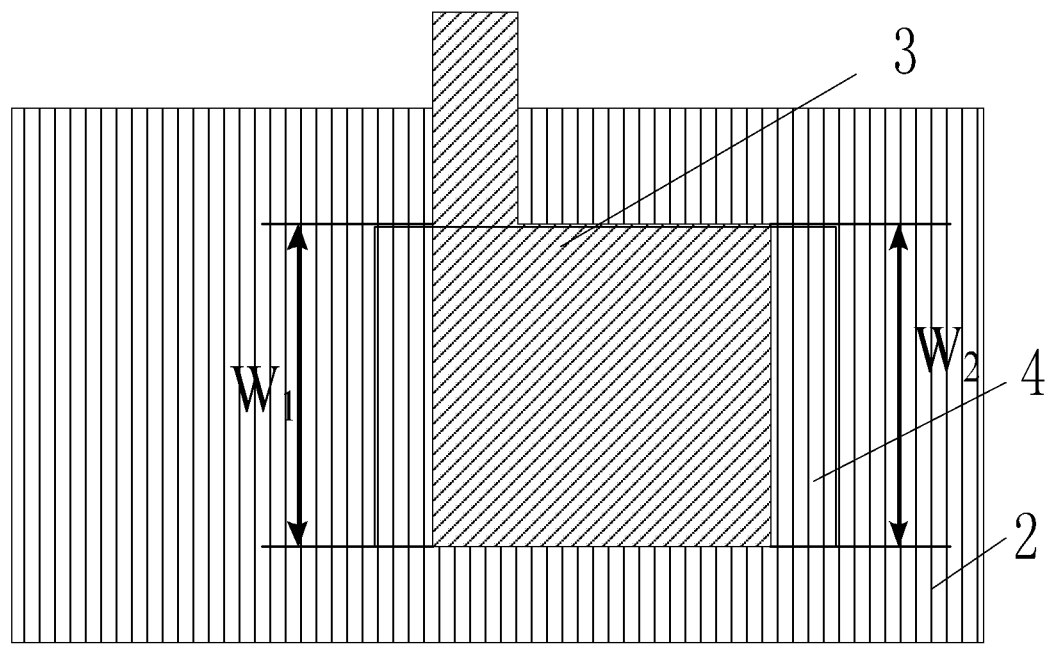
FIG. 2 is a schematic plan view of the thin film transistor shown in FIG. 1, in which a gate electrode and a second insulating layer are omitted.

As shown in FIG. 1 and FIG. 2, a schematic structural view of a thin film transistor according to an embodiment of the present disclosure is shown. FIG. 1 is a front view, and FIG. 2 is a plan view. It should be noted that, a second insulating layer and a gate electrode of the thin film transistor are omitted in FIG. 2, in order to show an active layer of the thin film transistor. The thin film transistor may include a base substrate 1, a source electrode 2 provided on the base substrate 1, a drain electrode 3 provided on the source electrode 2, an active layer 4 provided between the source electrode 2 and the drain electrode 3, and a gate electrode 5. A first insulating layer 6 for insulating the source electrode 2 from the drain electrode 3 is provided between the source electrode 2 and the drain electrode 3. A second insulating layer 7 for insulating the active layer 4 from the gate electrode 4 is provided between the active layer 4 and the gate electrode 5. Under a control of the gate electrode 5, the active layer 4 between the source electrode 2 and the drain electrode 3 may form a conductive area, that is, form a channel of the thin film transistor. Therefore, a length of the first insulating layer surrounded by the active layer 4 may be regarded as a width of the channel, and a vertical distance between the source electrode and the drain electrode may be regarded as a length of the channel.

In the embodiment of the present disclosure, a vertical channel structure is formed by stacking the source electrode, the active layer and the drain electrode in a direction perpendicular to the base substrate, and the gate electrode surrounds the drain electrode and the active layer, thereby reducing an occupied area of the thin film transistor and increasing an aperture ratio of a display panel including the thin film transistor. Therefore, when the thin film transistor is applied into a display device, an occupied area of a peripheral circuit of the display device in a frame may be reduced, which is advantageous for realizing a narrow frame or a frameless display device. Herein, the expression that a component A "surrounds" a component B means that a projection of the component A in a direction parallel to an upper surface of the base substrate at least partially overlaps with a projection of the component B in the direction parallel to the upper surface of the base substrate.

Figure 3A:
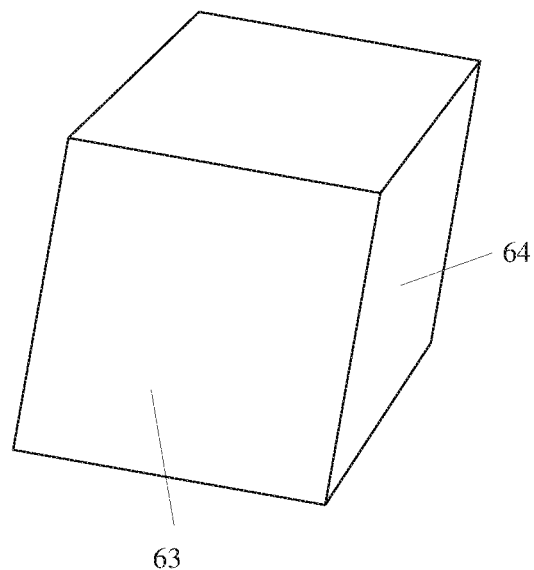
FIG. 3A and FIG. 3B are perspective views of a first insulating layer of the thin film transistor according to an embodiment of the present disclosure.
Figure 3B:
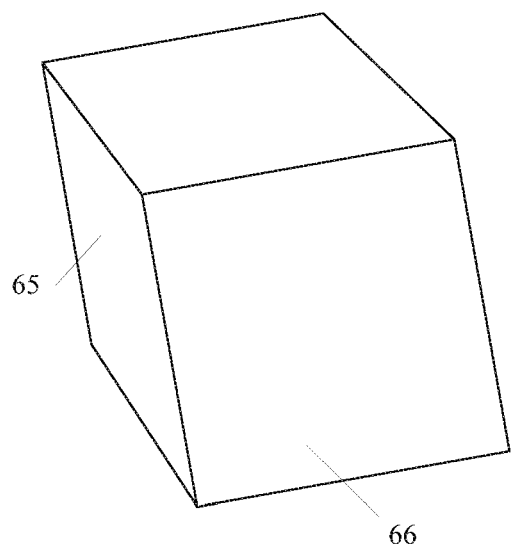

Referring to FIG. 1, FIG. 3A and FIG. 3B, the first insulating layer 6 may have a hexahedral shape, that is, the first insulating layer 6 may include a lower surface 61 contacting the source electrode 2, an upper surface 62 contacting the drain electrode 3, and four side surfaces 63, 64, 65, 66 which are located between the upper surface and the lower surface and do not contact the source electrode 2 and the drain electrode 3 (that is, connecting the upper surface with the lower surface).

Referring back to FIGS. 1 and 2, the active layer 4 may surround two side surfaces 63, 65 of the first insulating layer 6. In this case, the length of the channel is equal to L, and the width W of the channel meets the equation $W=W_1+W_2$. Thus, it may be obtained to increase the width of the channel while the length of the channel is not changed, so that an on-state current of the thin film transistor is increased, thereby improving a charging ability of the thin film transistor.

In the embodiment, a first side surface 43 of the active layer 4 surrounds the side surface 63 of the first insulating layer 6, and a second side surface 45 of the active layer surrounds the side surface 65 of the first insulating layer 6. In this case, the gate electrode 5 may surround the first side surface 43 and the second side surface 45 of the active layer 4 to form a conductive area in the active layer 4. It should be understood that, in this case, the gate electrode 5 may surround two side surfaces, three side surfaces, four side surfaces or more side surfaces of the active layer 4. As stated above, the gate electrode 5 "surrounds" the first side surface 43 and the second side surface 45 of the active layer 4, that is, a projection of the gate electrode 5 in the direction parallel to the upper surface of the base substrate at least partially overlaps with a projection of both the first side surface 43 and the second side surface 45 in the direction parallel to the upper surface of the base substrate.

Figure 4:
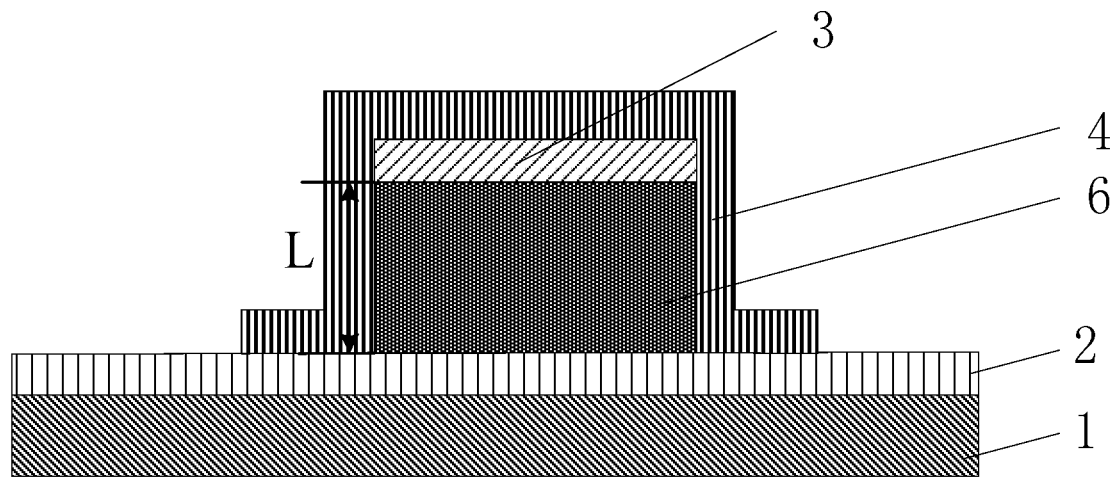
FIG. 4 is a schematic structural view of a thin film transistor, in which a gate electrode and a second insulating layer are omitted, according to another exemplary embodiment of the present disclosure.
Figure 5:
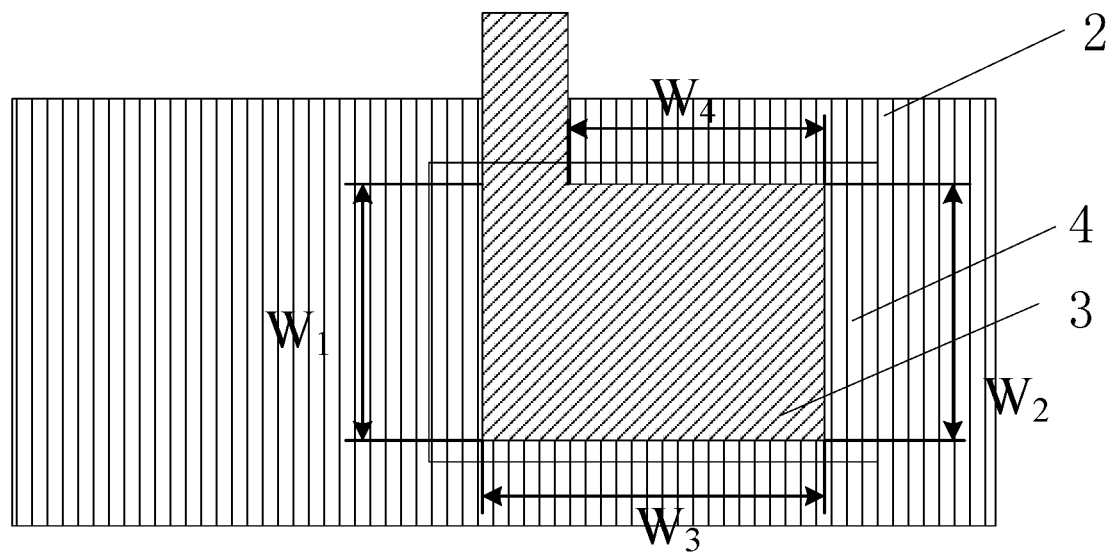
FIG. 5 is a schematic plan view of the thin film transistor shown in FIG. 4.

FIG. 4 and FIG. 5 show a thin film transistor according to another embodiment of the present disclosure, in which the second insulating layer and the gate electrode are omitted in order to clearly show a relationship between the active layer and the drain electrode. The structure of the thin film transistor according to this embodiment is substantially the same as that of the thin film transistor according to the above embodiment, unless otherwise specified, and only differences between the two embodiments will be described below.

As shown in FIG. 4 and FIG. 5, the active layer 4 may surround four side surfaces 63, 64, 65, 66 of the first insulating layer 6, that is, the active layer 4 surrounds all side surfaces of the first insulating layer 6. In this case, the length of the channel is equal to L, and the width W of the channel meets the equation $W=W_1+W_2+W_3+W_4$. Thus, it may be obtained to further increase the width of the channel while the length of the channel is not changed, so that the on-state current of the thin film transistor is further increased, thereby further improving the charging ability of the thin film transistor.

In the above embodiments, the first insulating layer 6 has a hexahedral shape, and the active layer 4 surrounds two or four side surfaces of the first insulating layer 6. It should be understood that the active layer 4 may surround other numbers (e.g., one or three) of the side surfaces of the first insulating layer 6.

Figure 6:
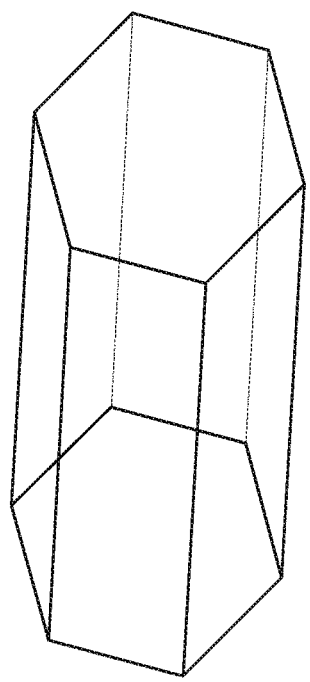
FIG. 6 is a perspective view of a first insulating layer of a thin film transistor according to another embodiment of the present disclosure.

In other embodiments, the first insulating layer 6 may have other shapes. For example, as shown in FIG. 6, the first insulating layer 6 may have an octahedral shape, and the active layer 4 may surround one, two, three, four, five or six side surfaces of the first insulating layers 6. That is to say, the active layer 4 may surround at least one side surface of the first insulating layer 6 or may surround all side surfaces of the first insulating layer 6. As stated above, the active layer 4 "surrounds" at least one side surface of the first insulating layer 6, that is, a projection of the active layer 4 in the direction parallel to the upper surface of the base substrate at least partially overlaps with a projection of the at least one side surface of the first insulating layer 6 in the direction parallel to the upper surface of the base substrate.

Optionally, the first insulating layer may also have a shape of other three-dimensional structures, such as a cubic, a dodecahedron, other irregularly three-dimensional structures or the like.

Figure 7:
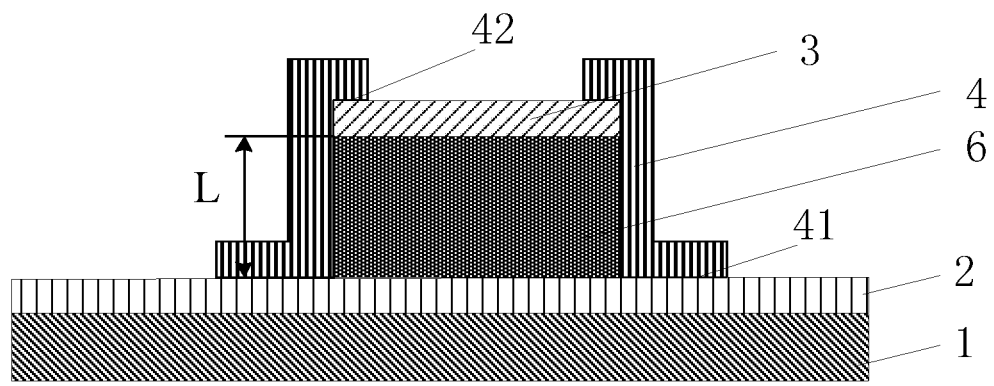
FIG. 7 is a schematic structural view of a thin film transistor, in which a gate electrode and a second insulating layer are omitted, according to another exemplary embodiment of the present disclosure.
Figure 8:
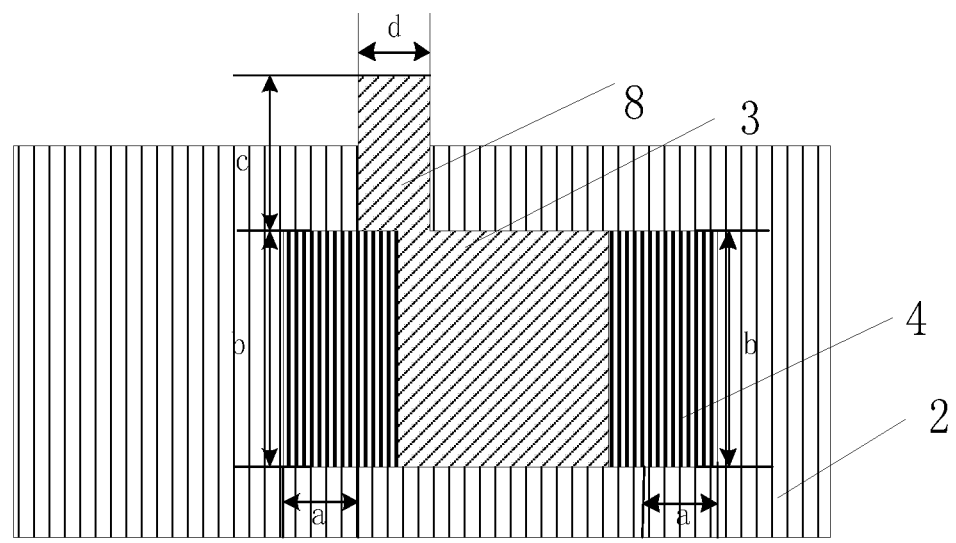
FIG. 8 is a schematic plan view of the thin film transistor shown in FIG. 7.

Further, as shown in FIG. 7 and FIG. 8, the active layer 4 may include a first contact face 41 for contacting the source electrode 2, and a second contact face 42 for contacting the drain electrode 3. The first contact face 41 forms a contact area where the active layer 4 contacts with the source electrode 2, and the second contact face 42 forms a contact area where the active layer 4 contacts with the drain electrode 3, such that the source electrode 2 may be brought into conduction with the drain electrode 3 through the active layer 4 under the control of the gate electrode.

For example, an area of a cross section of at least one of the first contact face 41 and the second contact face 42 in a direction parallel to the base substrate 1 may be greater than an area of a cross section of the first side surface 43 in the direction parallel to the base substrate 1. As shown in FIG. 8, a width of the contact area formed by the first contact face 41 is labeled by the reference numeral "a", and a length of the contact area formed by the first contact face 41 is labeled by the reference numeral "b". If the contact area is small, the electrical conduction area is small, so that the current is concentrated in the small conduction area, thus it is easy to cause local heating. In an embodiment of the present disclosure, the contact area may be set to be large, for example, the value of "a" may be greater than or equal to 100 nm, such that the contact area where the active layer 4 contacts with the source electrode 2 may become large to an extent. That is, the conduction area may be as large as possible. In this way, the current may be easily dispersed, and the heat due to current concentration is excessively reduced, thereby avoiding problems such as burnout of the display panel. Correspondingly, the contact area formed by the second contact face 42 may also be similarly set such that the contact area where the active layer 4 contacts with the drain electrode 3 may become large to an extent, that is, the conduction area is as large as possible.

In FIG. 8, a projecting portion, which has a length labeled by the reference numeral "c" and a width labeled by the reference numeral "d", is a signal line 8 for the drain electrode. Referring to FIG. 5 and FIG. 8, the following equation may be met: $W_1=W_2$, $W_3=W_4+d$. In an embodiment, the channel may surround a periphery of the drain electrode. Compared with a conventional channel which has only one width, the width of the channel becomes about four times of the width of the conventional channel. Thus, it may be obtained to further increase the width of the channel while the length of the channel is not changed, so that the on-state current of the thin film transistor is further increased, thereby further improving the charging ability of the thin film transistor.

Referring back to FIG. 1, FIG. 2, FIG. 4 and FIG. 5, an orthographic projection of the drain electrode 3 on the base substrate 1 or on the source electrode 2 substantially covers an orthographic projection of the first insulating layer 6 on the base substrate 1 or on the source electrode 2. An orthographic projection of the active layer 4 on the base substrate 1 or on the source electrode 2 substantially covers the orthographic projection of the drain electrode 3 on the base substrate 1 or on the source electrode 2. As a result, the active layer 4 may surround both the drain electrode 3 and the first insulating layer 6.

In an alternative embodiment, referring to FIG. 7 and FIG. 8, the orthographic projection of the active layer 4 on the base substrate 1 or on the source electrode 2 overlaps with the orthographic projection of the drain electrode 3 on the base substrate 1 or on the source electrode 2. That is, a portion of the drain electrode 3 is not covered by the active layer 4. In this way, it may save a material usage of the active layer 4, thereby reducing the cost.

Figure 9:
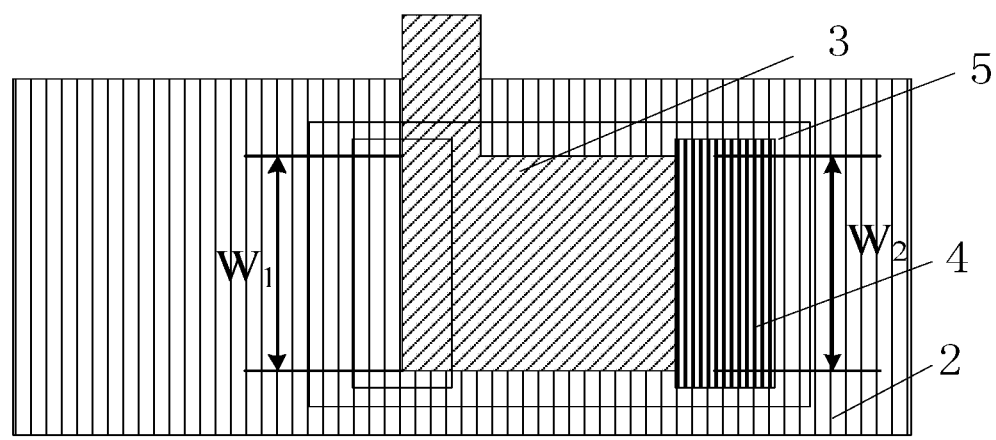
FIG. 9 and FIG. 10 are schematic plan views of the thin film transistor according to the embodiment of the present disclosure, in which a relationship between a gate electrode and an active layer are schematically shown.
Figure 10:
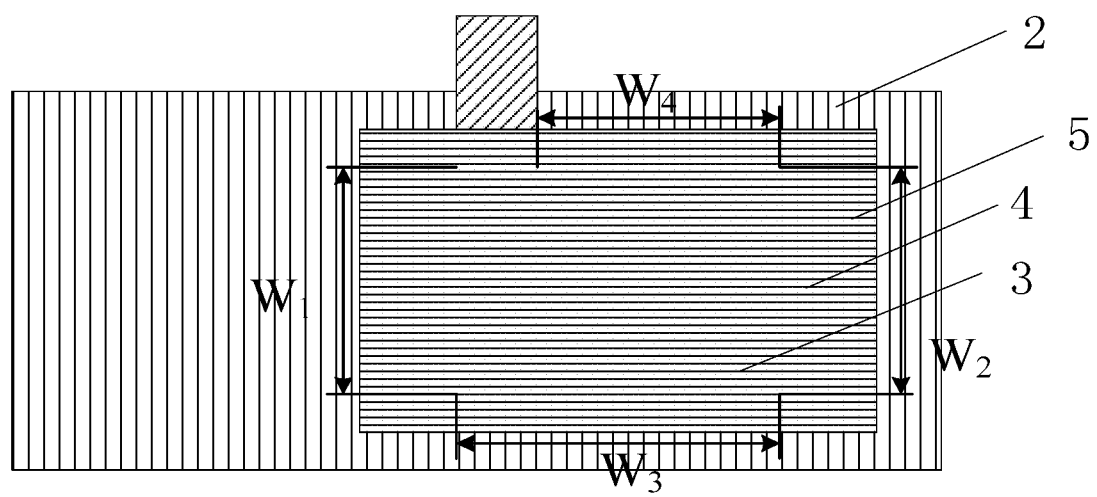

According to an exemplary embodiment of the present disclosure, as shown in FIG. 9 and FIG. 10, the gate electrode 5 may surround all side surfaces of the active layer 4. For example, in combination of FIG. 1 with FIG. 9, the active layer 4 surrounds two side surfaces of the first insulating layer 6, and in this case, the gate electrode 5 may surround all side surfaces of the active layer 4. For example, an orthographic projection of the gate electrode 5 on the base substrate 1 or on the source electrode 2 covers the orthographic projection of the active layer 4 on the base substrate 1 or on the source electrode 2. In combination of FIG. 4 with FIG. 10, the active layer 4 surrounds four side surfaces of the first insulating layer 6, and in this case, the gate electrode 5 may still surround all side surfaces of the active layer 4. For example, the orthographic projection of the gate electrode 5 on the base substrate 1 or on the source electrode 2 covers the orthographic projection of the active layer 4 on the base substrate 1 or on the source electrode 2.

Optionally, the material used for the first insulating layer 6 and/or the second insulating layer 7 may include aluminum oxide (i.e., $Al_2O_3$). The aluminum oxide has better dielectric properties than other compounds (for example, silicon nitride), so that an insulation property of the first insulating layer 6 and the second insulating layer 7 may be ensured. Therefore, in the embodiments of the present disclosure, the first insulating layer 6 and/or the second insulating layer 7 are made of aluminum oxide, thereby avoiding a current leakage. Optionally, other insulating materials such as silicon nitride, silicon oxide or the like may be used to form the first insulating layer 6 and the second insulating layer 7. The first insulating layer 6 and the second insulating layer 7 may be made of the same insulating material or different insulating materials, which is not limited herein.

Figure 11A:
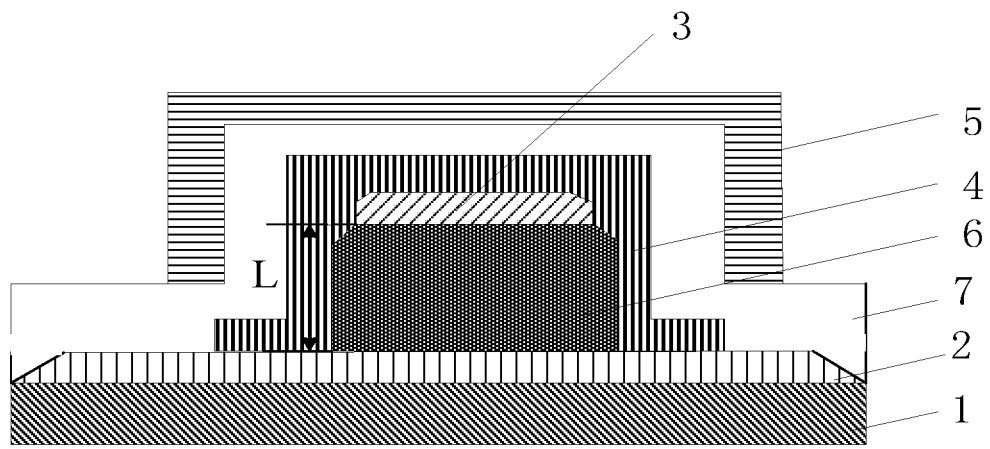
FIG. 11A is a schematic structural view of a thin film transistor according to another exemplary embodiment of the present disclosure.
Figure 11B:
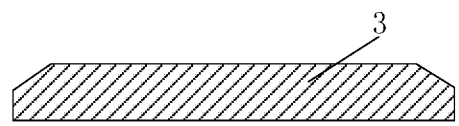
FIG. 11B is a cross-sectional view showing a drain electrode of the thin film transistor shown in FIG. 11A.

Optionally, each of the source electrode 2 and the drain electrode 3 may have a single-layer metal structure or a multilayer metal structure. In the thin film transistor according to an embodiment of the present disclosure, each of the source electrode 2 and the drain electrode 3 may have a single-layer metal structure, and may include, for example, molybdenum (Mo), tungsten (W), aluminum (Al) alloy, copper (Cu) alloy, or the like. Alternatively, each of the source electrode 2 and the drain electrode 3 may have a multi-layer metal structure. In this case, compositions of an etching liquid applied in a wet etching or an etching atmosphere applied in a dry etching may be adjusted to make each of the source electrode 2 and the drain electrode 3 have a suitable slope. For example, as shown in FIG. 11A, a partial cross section of each of the source electrode 2 and the drain electrode 3 in a direction perpendicular to the base substrate 1 has a positive trapezoidal shape, and FIG. 11B shows that a partial cross section of the drain electrode 3 in the direction perpendicular to the base substrate 1 has a positive trapezoidal shape. It should be noted that FIG. 11A and FIG. 11B are not drawn in actual scale in order to highlight the positive trapezoidal shape. Further, a partial cross section of the first insulating layer 6 in the direction perpendicular to the base substrate 1 may also have a positive trapezoidal shape. In this way, it may prevent the cross section of each of the source electrode 2, the first insulating layer 6 and the drain electrode 3 in the direction perpendicular to the base substrate 1 from being formed into an inverted trapezoidal shape. As a result, it may avoid puncturing the active layer 4 and the second insulating layer 7, which may otherwise result in problems such as a leakage of the thin film transistor and a performance deterioration of the thin film transistor.

Figure 12:
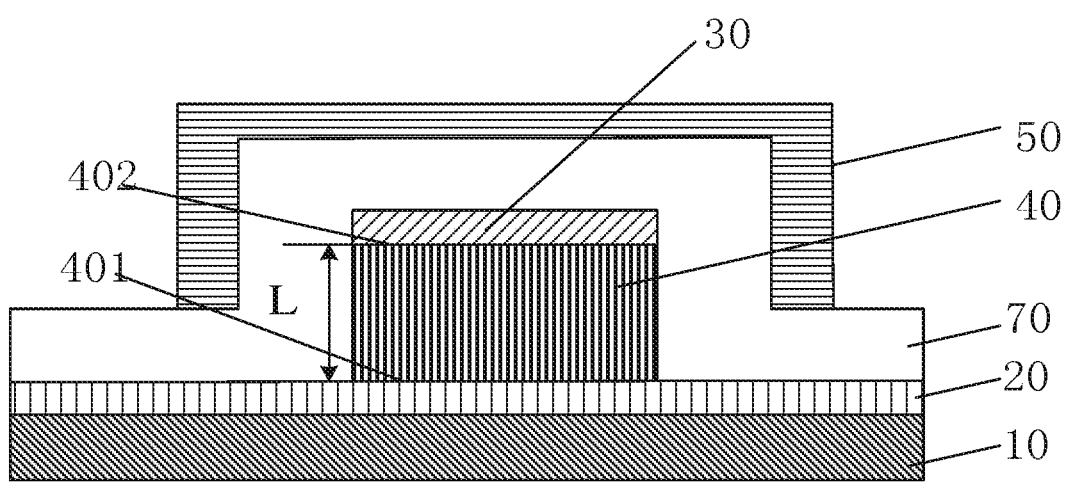
FIG. 12 is a schematic structural view of a thin film transistor according to another exemplary embodiment of the present disclosure.

As shown in FIG. 12, a schematic structural view of a thin film transistor according to another embodiment of the present disclosure is shown. The thin film transistor may include a base substrate 10, a source electrode 20 provided on the base substrate 10, a drain electrode 30 provided on the source electrode 20, an active layer 40 provided between the source electrode 20 and the drain electrode 30, and a gate electrode 50. The active layer 40 is configured to connect the source electrode 20 with the drain electrode 30 to form a channel of the thin film transistor. A second insulating layer 70 for insulating the active layer 40 from the gate electrode 50 is provided between the active layer 40 and the gate electrode 50. The gate electrode 50 surrounds the active layer 40.

Figure 13A:
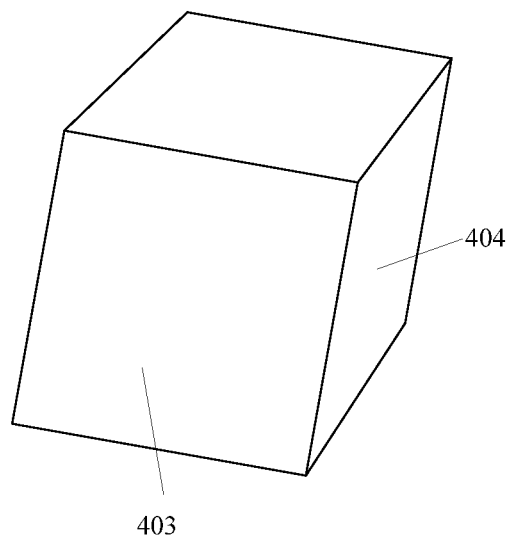
FIG. 13A and FIG. 13B are respectively a schematic perspective view and a schematic plan view of an active layer of a thin film transistor according to an embodiment of the present disclosure.
Figure 13B:
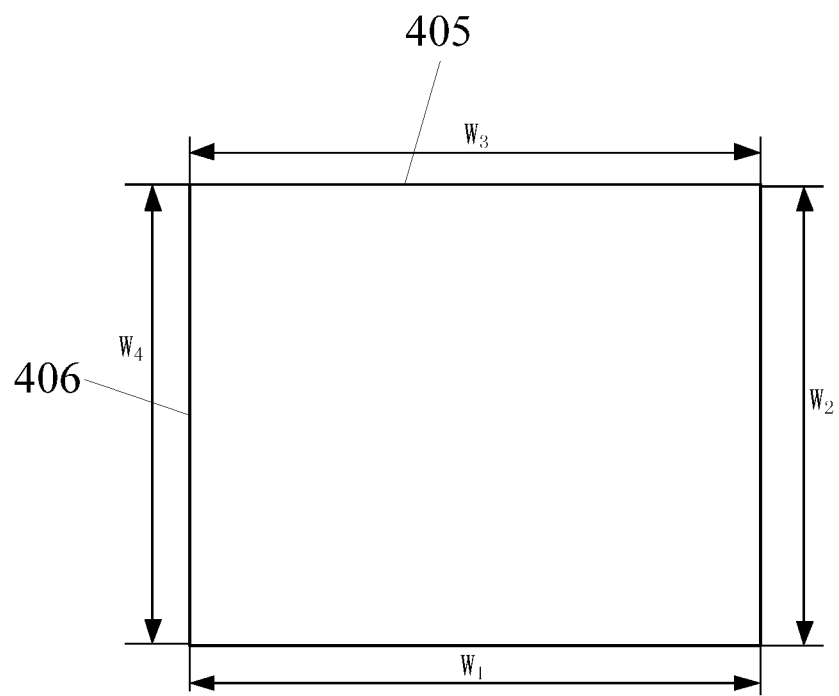

FIG. 13A and FIG. 13B show a perspective view and a plan view of the active layer 40, respectively. In this embodiment, the active layer 40 may have a hexahedral shape. For example, the active layer 40 may include a lower surface 401 contacting the source electrode 20, an upper surface 402 contacting the drain electrode 30, as well as a first side surface 403, a second side surface 404, a third side surface 405, and a fourth side surface 406. The first side surface 403, the second side surface 404, the third side surface 405, and the fourth side surface 406 each extend in a direction intersecting an upper surface of the base substrate 10.

Herein, "extend in a direction intersecting an upper surface of the base substrate 10" may be understood to extend in a direction which is not parallel to the upper surface of the base substrate 10, for example, in a direction perpendicular to the upper surface of the base substrate 10.

In the embodiments of the present disclosure, a vertical channel structure is formed by stacking the source electrode, the active layer, and the drain electrode in the direction perpendicular to the base substrate, and the gate electrode surrounds both the drain electrode and the active layer, thereby reducing an occupied area of the thin film transistor and increasing an aperture ratio of a display panel including the thin film transistor. Therefore, when the thin film transistor is applied into a display device, an occupied area of a peripheral circuit of the display device in a frame may be reduced, which is advantageous for realizing a narrow frame or a frameless display device.

For example, the first side surface 403, the second side surface 404, the third side surface 405, and the fourth side surface 406 of the active layer 40 may all connect the source electrode 20 with the drain electrode 30. In this way, the four side surfaces of the active layer 40 all form the channel of the thin film transistor. As a result, a perimeter of the active layer 40 may be regarded as the width of the channel, and a vertical distance between the source electrode and the drain electrode may be regarded as the length of the channel. That is, the width of the channel may met the equation $W=W_1+W_2+W_3+W_4$, and the length of the channel is equal to L. Thus, it may be obtained to further increase the width of the channel while the length of the channel is not changed, so that the on-state current of the thin film transistor is further increased, thereby further improving the charging ability of the thin film transistor.

In the illustrated embodiment, the gate electrode 50 surrounds the four side surfaces of the active layer 40 to form a conductive area in the active layer 40. It should be understood that, in this case, the gate electrode 50 may surround one side surface, two side surfaces, three side surfaces, or more side surfaces of the active layer 40.

In other embodiments, the active layer 40 may have other shapes. For example, similar to FIG. 6, the active layer 40 may have an octahedral shape. In this case, except for the two surfaces contacting the source electrode and the drain electrode, the active layer 40 has six side surfaces. At least one of the six side surfaces may be configured to connect the source electrode with the drain electrode, and the gate electrode may surround the at least one of the six side surfaces.

It should be noted that, in the above embodiments, the source electrode and the drain electrode may be interchanged. For example, the drain electrode is provided on the base substrate, the source electrode is provided on the drain electrode, and the first insulating layer or the active layer is located between the drain electrode and the source electrode. That is, the drain electrode, the first insulating layer, and the source electrode are sequentially stacked on the base substrate, or the drain electrode, the active layer, and the source electrode are sequentially stacked on the base substrate. Thus, in the above embodiments, the thin film transistor may include a base substrate, and a first electrode, a second electrode, and a gate electrode provided on the base substrate, wherein the first electrode is one of the source electrode and the drain electrode, and the second electrode is the other one of the source electrode and drain electrode.

Of course, the thin film transistor provided by the embodiments of the present disclosure may further include other film layers, and details are not described herein again.

Figure 14:
FIG. 14 is a schematic view of an array substrate according to an embodiment of the present disclosure.

According to an embodiment of the present disclosure, an array substrate 140 is also provided. As shown in FIG. 14, the array substrate 140 may include the thin film transistor 100 provided by any of the above embodiments.

Of course, the array substrate according to the embodiment of the present disclosure may be applied to a liquid crystal display panel, and may also be applied to an organic electroluminescent display panel, which are not limited herein.

Figure 15:
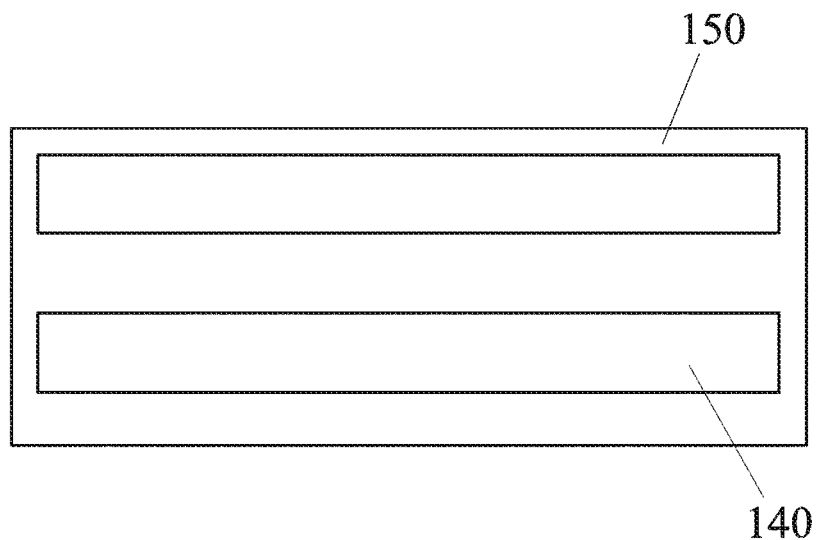
FIG. 15 is a schematic view of a display panel according to an embodiment of the present disclosure.

According to an embodiment of the present disclosure, a display panel 150 is further provided. As shown in FIG. 15, the display panel 150 may include the array substrate 140 provided by the above embodiment.

Figure 16:
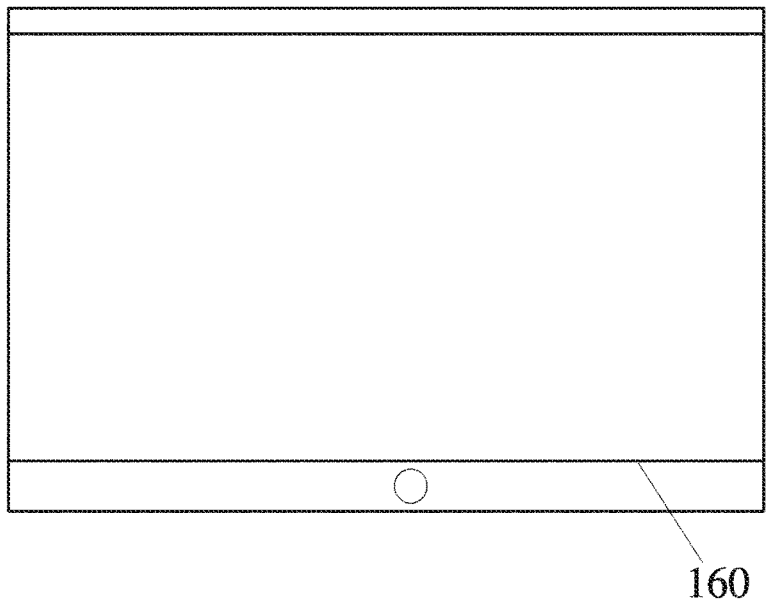
FIG. 16 is a schematic view of a display device according to an embodiment of the present disclosure.

According to an embodiment of the present disclosure, a display device 160 is further provided. As shown in FIG. 16, the display device 160 may include the display panel 150 provided by the above embodiment. Therefore, when the thin film transistor is applied into a display device, an occupied area of a peripheral circuit of the display device in a frame may be reduced, which is advantageous for realizing a narrow frame or a frameless display device.

The display device may be any product or component having a display function, such as a mobile phone, a television, a tablet, a display, a notebook computer, a digital photo frame, a navigator, and the like.

Figure 17:
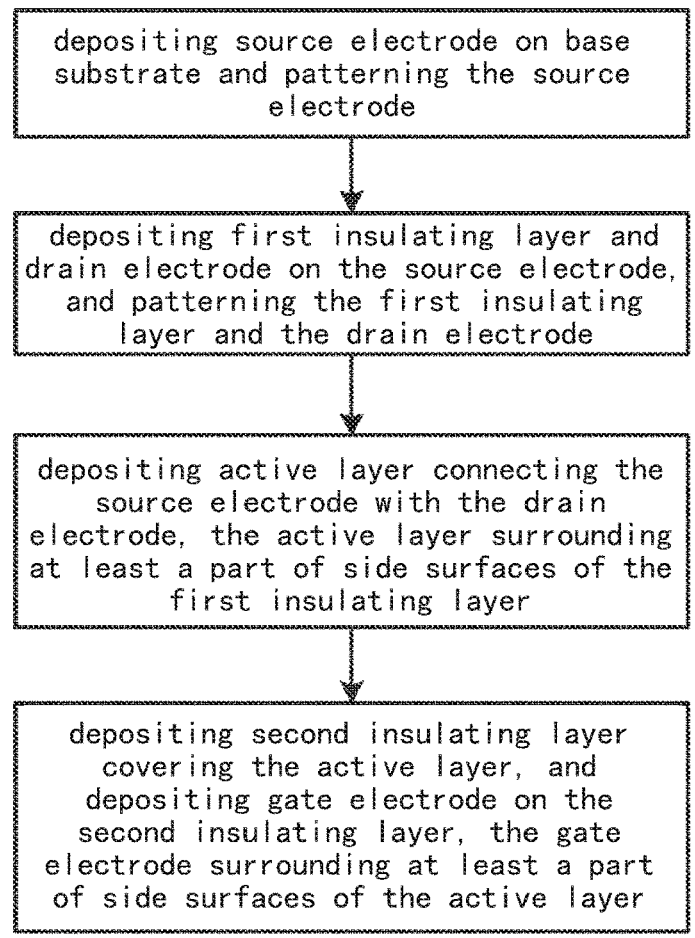
FIG. 17 is a flow chart of a method for manufacturing a thin film transistor according to an embodiment of the present disclosure.
Figure 18:
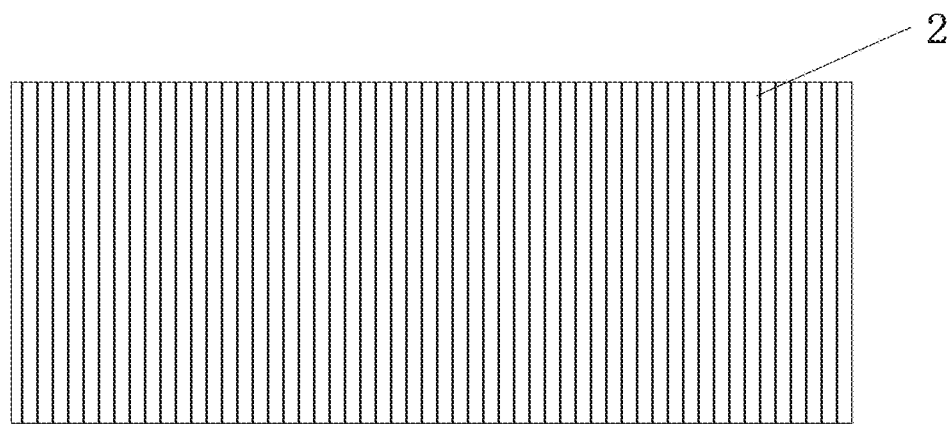
FIG. 18 to FIG. 21 are views schematically showing a structure formed after a part of main steps of the method shown in FIG. 17 is performed.
Figure 19:
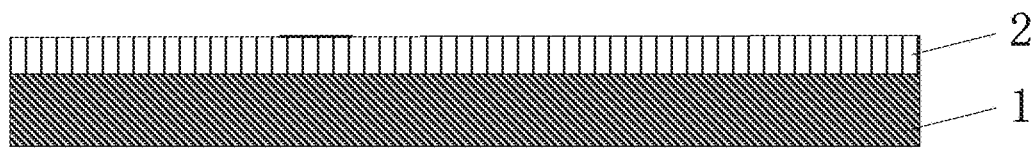
Figure 20:
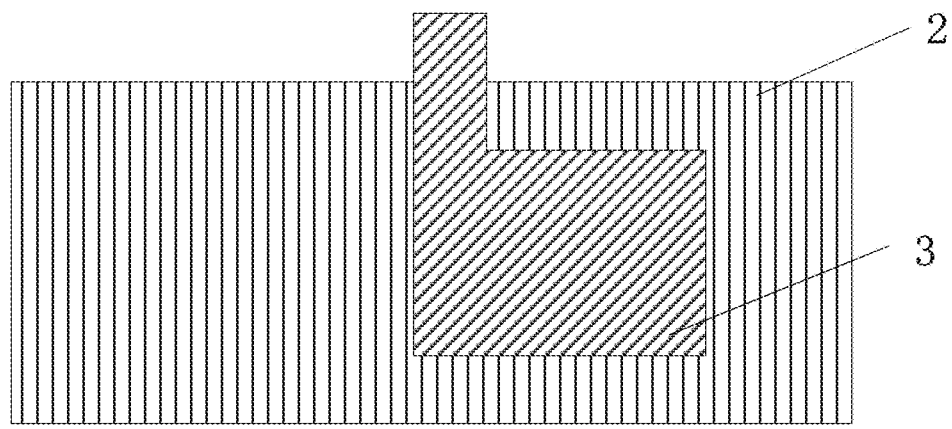
Figure 21:
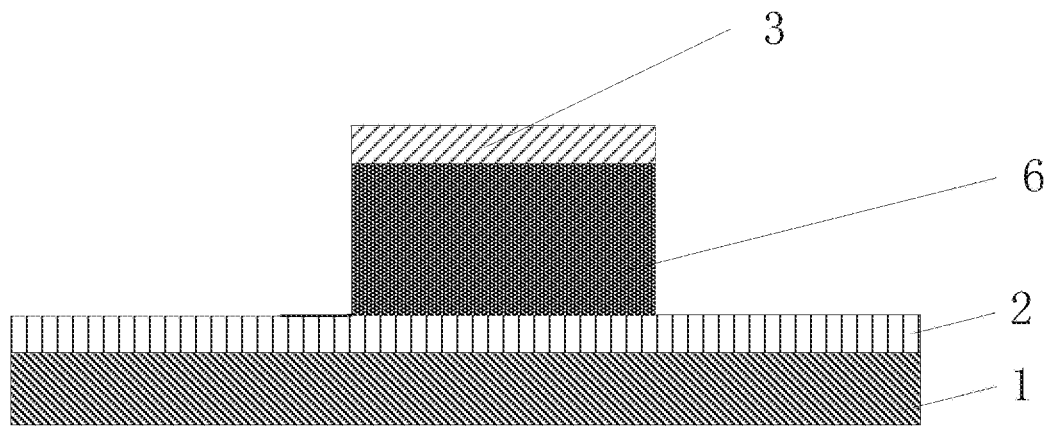

According to an embodiment of the present disclosure, as shown in FIG. 17, a method for manufacturing a thin film transistor is further provided, including:

depositing a source electrode 2 on a base substrate 10 and patterning the source electrode 2, as shown in FIG. 18 and FIG. 19;

depositing a first insulating layer 6 and a drain electrode 3 on the source electrode 2, and patterning the first insulating layer 6 and the drain electrode 3, as shown in FIG. 20 and FIG. 21;

depositing an active layer 4 connecting the source electrode 2 with the drain electrode 3, the active layer 4 surrounding at least a part of side surfaces of the first insulating layer 6, as shown in FIG. 4 and FIG. 5; and depositing a second insulating layer 7 covering the active layer 4, and depositing a gate electrode 5 on the second insulating layer 7, the gate electrode 5 surrounding at least a part of side surfaces of the active layer 4, the side surfaces of the active layer 4 surrounded by the gate electrode 5 including the side surfaces of the active layer 4 surrounding the first insulating layer 6, as shown in FIG. 1 and FIG. 10.

The active layer 4 requires a high film quality, for example, the active layer 4 needs to be deposited up to a thickness of 50 nm to 100 nm without non-continuous film in order to avoid defects. Therefore, an atomic layer deposition (abbreviated as ALD) technology may be employed to deposit the active layer 4 so as to increase a coverage of the active layer 4 and reduce defects. Advantageously, the ALD process may better protect organic materials from being invaded by oxygen and water while contributing to an overall lifetime and performance of the display panel.

Optionally, the ALD process may also be employed to form the first insulating layer 6 and the second insulating layer 7 so as to increase a coverage and a film quality of the first insulating layer 6 and the second insulating layer 7.

Figure 22:
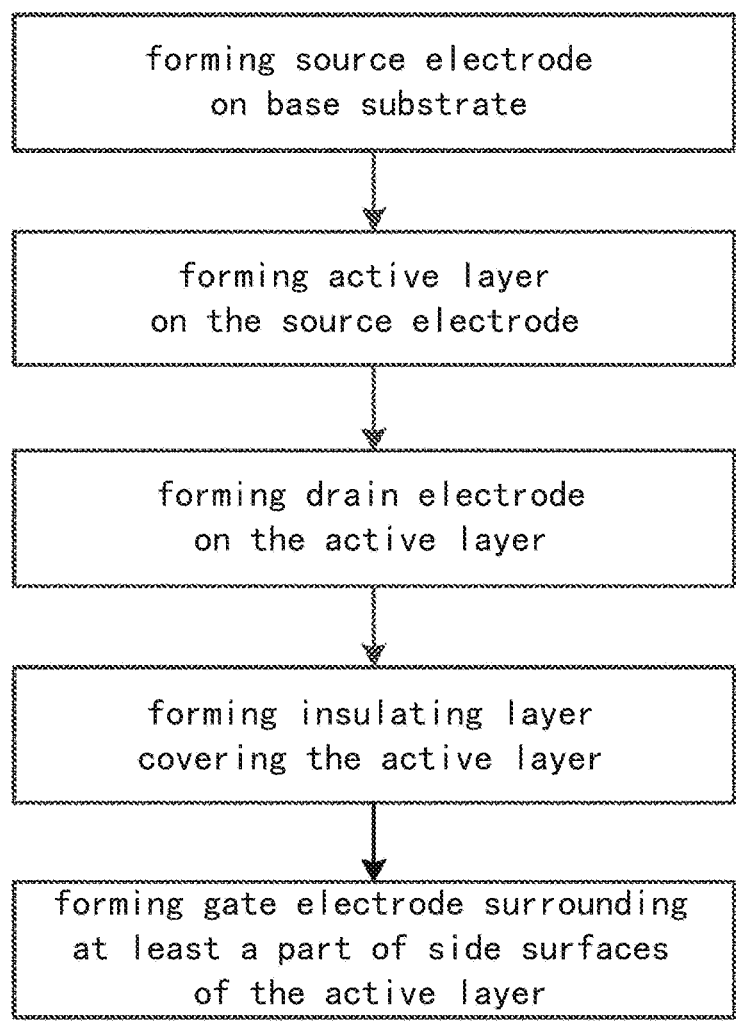
FIG. 22 is a flow chart of a method for manufacturing a thin film transistor according to another embodiment of the present disclosure.

According to an embodiment of the present disclosure, as shown in FIG. 12 and FIG. 22, a method for manufacturing a thin film transistor is further provided, including:

forming a source electrode 20 on a base substrate 10;

forming an active layer 40 on the source electrode 20;

forming a drain electrode 30 on the active layer 40;

forming an insulating layer 70 covering the active layer 30; and forming a gate electrode 50 surrounding at least a part of side surfaces of the active layer 30.

The at least a part of side surfaces of the active layer 30 may connect the source electrode 20 with the drain electrode 30.

In the embodiments of the present disclosure, it may be obtained to increase the width of the channel while the length of the channel is not changed, so that an on-state current of the thin film transistor is increased. Further, when the thin film transistor is applied into a display panel, an aperture ratio of the display panel may be increased and an occupied area of a peripheral circuit may be reduced, which is advantageous for realizing a narrow frame or a frameless display device.

It will be apparent to those skilled in the art that various changes and modifications can be made without departing from the spirit and scope of the disclosure. Thus, the present disclosure is intended to include these changes and modifications if these changes and modifications fall within the scope of the appended claims and equivalents thereof.

What is claimed is:

1. A thin film transistor comprising:
   a base substrate;
   a first electrode on the base substrate;
   a second electrode on the first electrode;
   an active layer provided on the base substrate and connecting the first electrode with the second electrode; and
   a gate electrode on the base substrate, wherein the base substrate comprises an upper surface facing towards the first electrode, the active layer comprises a first side wall, a second side wall, a third side wall and a fourth side wall, each of the first side wall, the second side wall, the third side wall and the fourth side wall extending in a direction intersecting the upper surface of the base substrate;

wherein all of the first side wall, the second side wall, the third side wall and the fourth side wall connect the first electrode with the second electrode, and the gate electrode surrounds the first side wall, the second side wall, the third side wall and the fourth side wall;

wherein the active layer comprises a first contact face for contacting the first electrode, and a second contact face for contacting the second electrode;

wherein an area of a cross section of at least one of the first contact face or the second contact face in a direction parallel to the upper surface of the base substrate is larger than an area of a cross section of the first side wall in the direction parallel to the upper surface of the base substrate;

wherein an orthographic projection of each of the first side wall and the second side wall on the upper surface of the base substrate extends in a first direction, an orthographic projection of each of the third side wall and the fourth side wall on the upper surface of the base substrate extends in a second direction, both the first direction and the second direction are parallel to the upper surface of the base substrate, and the first direction is perpendicular to the second direction; and wherein a length of the orthographic projection of the first side wall on the upper surface of the base substrate in the first direction is labeled as $W_1$, a length of the orthographic projection of the second side wall on the upper surface of the base substrate in the first direction is labeled as $W_2$, a length of the orthographic projection of the third side wall on the upper surface of the base substrate in the second direction is labeled as $W_3$, and a length of the orthographic projection of the fourth side wall on the upper surface of the base substrate in the second direction is labeled as $W_4$, and wherein $W_1$ is equal to $W_2$, and $W_3$ is larger than $W_4$.

2. The thin film transistor of claim 1, wherein the thin film transistor further comprises a first insulating layer between the first electrode and the second electrode, the first insulating layer comprising at least four side surfaces, the at least four side surfaces of the first insulating layer being surfaces of the first insulating layer which are not in contact with the first electrode or the second electrode, and the active layer surrounding the at least four side surfaces of the first insulating layer.

3. The thin film transistor of claim 1, wherein the active layer is positioned between the first electrode and the second electrode.

4. The thin film transistor of claim 3, wherein an orthographic projection of the active layer on the base substrate is within an orthographic projection of each of the first electrode and the second electrode on the base substrate.

5. The thin film transistor of claim 1, wherein the thin film transistor further comprises a second insulating layer between the active layer and the gate electrode.

6. The thin film transistor of claim 2, wherein an orthographic projection of the active layer on the base substrate at least partially overlaps with an orthographic projection of the second electrode on the base substrate.

7. The thin film transistor of claim 1, wherein an orthographic projection of the gate electrode on the base substrate covers an orthographic projection of the active layer on the base substrate.

8. The thin film transistor of claim 2, wherein a material of at least one of the first insulating layer and the second insulating layer comprises aluminum oxide.

9. The thin film transistor of claim 1, wherein at least one of the first electrode and the second electrode comprises a single-layer metal structure or a multilayer metal structure.

10. The thin film transistor of claim 2, wherein a part of a cross section of each of the first insulating layer and the second electrode in a direction perpendicular the upper surface of to the base substrate has a positive trapezoidal shape.

11. An array substrate comprising the thin film transistor of claim 1.

12. A display panel comprising the array substrate of claim 11.

13. A display device comprising the display panel of claim 12.

14. The thin film transistor of claim 1, wherein an orthographic projection of the active layer on the base substrate covers an orthographic projection of the second electrode on the base substrate.

* * * * *